United States Patent [19]

Kim et al.

[11] Patent Number: 5,508,939
[45] Date of Patent: Apr. 16, 1996

[54] METHOD OF PARTIONING A CIRCUIT

[75] Inventors: Jaeseok Kim, Westfield; Nam-Sung Woo, New Providence, both of N.J.

[73] Assignee: AT&T Corp., Murray Hill, N.J.

[21] Appl. No.: 75,203

[22] Filed: Jun. 10, 1993

[51] Int. Cl.$^6$ .................................................. G06F 17/50
[52] U.S. Cl. .............................. 364/490; 364/489
[58] Field of Search ................................. 364/488, 489, 364/490, 491

[56] References Cited

U.S. PATENT DOCUMENTS

| | | | |
|---|---|---|---|
| 5,113,352 | 5/1992 | Finnerty | 364/490 |
| 5,140,526 | 8/1992 | McDermith et al. | 364/488 |
| 5,202,840 | 4/1993 | Wong | 364/490 |
| 5,222,031 | 6/1993 | Kaida | 364/491 |
| 5,229,953 | 7/1993 | Isozaki et al. | 364/490 |
| 5,341,308 | 8/1994 | Mendel | 364/489 |

OTHER PUBLICATIONS

"A Linear–Time Heuristic for Improving Network Partition" by C. M. Fiduccia, R. M. Mattheyses, Proc of 19th IEEE Design Automation Conf, pp. 175–181(1982).

"An Improved Min–Cut Algorithm for Partitioning VLSI Networks" by Balakrishnan Krishnamurthy, IEEE Transactions on Computers, vol. C–33, No. 5, pp. 438–446 (1984).

"Multiply–Way Network Partitioning" by Laura A. Sanchis, IEEE Transactions on Computers, vol. 38, No. 1, pp. 62–81 (1989).

*Primary Examiner*—Vincent N. Trans
*Attorney, Agent, or Firm*—Geoffrey D. Green

[57] ABSTRACT

Interconnected cells, such as gates, are partitioned into blocks, such as integrated circuits, wherein the blocks have at least one constraint, such as number of pins available, on the placement of cells therein. The cells are initially assigned to blocks at random or in accordance with a previously-determined initial partition. A quality factor, such as the total number of pins on all blocks, is determined for the initial partition and cells are moved from block to block to form a new partition. The cell moves are selected so as not to violate the constraints and in accordance with the likelihood of improving the overall quality of the partition. Such partitioning is repeated and the overall quality factor is recalculated for each new partition. When the quality factor does not improve substantially from partition to partition, the last partition for which the quality factor improved is selected as the best.

14 Claims, 4 Drawing Sheets

ND OF PARTIONING A CIRCUIT

METHOD OF PARTIONING A CIRCUIT

TECHNICAL FIELD

This invention relates to partitioning cells into blocks in circuit networks and more particularly to performing such partitioning with constraints such as the number of cells and number of terminal pins permitted for each block.

BACKGROUND OF THE INVENTION

Electronic circuits are often made up of gates or other circuit elements connected in networks. In some kinds of electronic circuits, multiple copies of gates or other circuit elements are typically implemented as integrated circuits and the overall electronic circuit consists of multiple integrated circuits assembled on one or more printed wiring boards. The connections among the integrated circuits are provided by wiring paths on the printed wiring boards. One typical electronic circuit of this kind uses devices called programmable gate arrays in which a relatively large number of gates is provided in an integrated circuit and the functions of and connections among the individual gates in the integrated circuit are specified by a "program." In some kinds of programmable gate arrays, the program is made part of the array during fabrication. In other kinds, known as field programmable gate arrays (FPGAs), the program is contained in a memory, such as a random-access or read-only memory associated with the array, or the program is "burned" into the array by electrically opening or closing fusible links.

In gate arrays and similar devices including multiple circuit elements, each gate or other circuit element can be thought of as a "cell" and the integrated circuits in which such gates are fabricated can be thought of as "blocks." In designing a circuit, a designer has the problem of partitioning the circuit by assigning the cells into blocks so that physical constraints, such as the number of cells in a block or the number of terminal pins on a block, are not violated. With programmable gate arrays, in which connections between cells can be made within a block, the choice of which cells in a circuit can be placed in a given block is often limited by the number of pins on the blocks. Blocks can also contain more than one type of cell, for example the Xilinx 4000 series FPGAs contain both configuration logic blocks and decoders. There may be other constraints to be imposed, such as limitations on types of cells or total power dissipated by cells.

The problem of partitioning a circuit into two or more blocks has received much attention. For example, see "A Linear-Time Heuristic for Improving Network Partitions" by C. M. Fiduccia and R. M. Mattheyses, Proc. of 19th IEEE Design Automation Conference, pp. 175–181, 1982; "An Improved Min-Cut Algorithm for Partitioning VLSI Networks" by Balakrishnan Krishnamurthy, IEEE Transactions on Computers, Vol. C-33, No. 5, pp. 438–446, 1984; and "Multiple-Way Network Partitioning" by Laura A. Sanchis in IEEE Transactions on Computers, Vol. 38, No. 1, pp. 62–81, 1989. However, the problems posed by pin limitations and multiple cell types in blocks remain.

SUMMARY OF THE INVENTION

In accordance with an exemplary embodiment of the invention, interconnected cells are partitioned into blocks with each block having at least one constraint on the placement of cells therein. The cells are first assigned to the blocks to form an initial partition, either at random or in accordance with a previously determined initial partition. An overall quality factor is calculated for the initial partition.

A new partition is then found by moving cells from block to block, the moves being selected so as not to violate the constraints and in accordance with the likelihood of improving the quality factor. The overall quality factor is then recalculated for the new partition, and the partitioning process repeated. When the quality factor does not improve substantially from partition to partition, the last partition for which the quality factor improved is selected as the best.

Constraints can be factors such as the number of cells permitted in a block and the number of terminal pins on each block. Such quality factor can be the total number of terminal pins on all the blocks; in which case the goal of the method is to find a partition with a minimum number of pins.

In a preferred embodiment, at least one of the constraints is relaxed for earlier partitions, thereby permitting cell moves that otherwise would not be permitted but which could have significant benefit in later partitions.

Other aspects of the invention will become apparent from the detailed description and the drawings.

DETAILED DESCRIPTION

Figure 1:
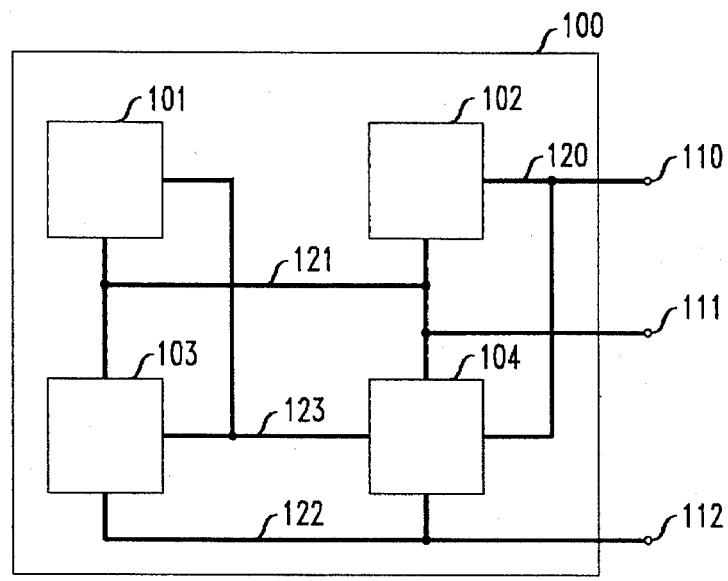
FIG. 1 is a diagram of a circuit block containing a number of cells.

FIG. 1 shows an exemplary circuit block 10 containing a number of circuit cells 101–1134. Circuit block 100 is simplified for explanatory purposes; a typical integrated circuit can include up to thousands of cells and up to hundreds of pins. However, FIG. 1 shows the same interrelationships of cells, pins and nets existing in more complex circuits.

Circuit block 10 can be, for example, an integrated circuit, such as an FPGA, and cells 101–104 can be logic gates. External terminals or pins 110–112 on block 100 are connected by means of interconnection networks (nets) 120–123 to various input terminals of cells 101–104. A list of the connections among cells made by the various nets in a block is typically referred to as a "netlist."

Net 121 connects terminals on each of cells 11–104 to pin 111, net 122 connects terminals on each of cells 103 and 104 to pin 112, and net 120 connects terminals on each of cells 102 and 104 to pin 110. However, net 123 is internal to block 100, that is, net 123 is not connected to a pin on block 100.

Each cell in a block is typically connected to more than one net, some of which may also be connected to pins on the block. In an actual circuit containing multiple blocks, a given net can interconnect cells in different blocks, requiring pins on each block to interconnect the portions of the net on each block. This interconnection is made external to the blocks, for example, by means of a lead on a printed wiring board.

Figure 2:
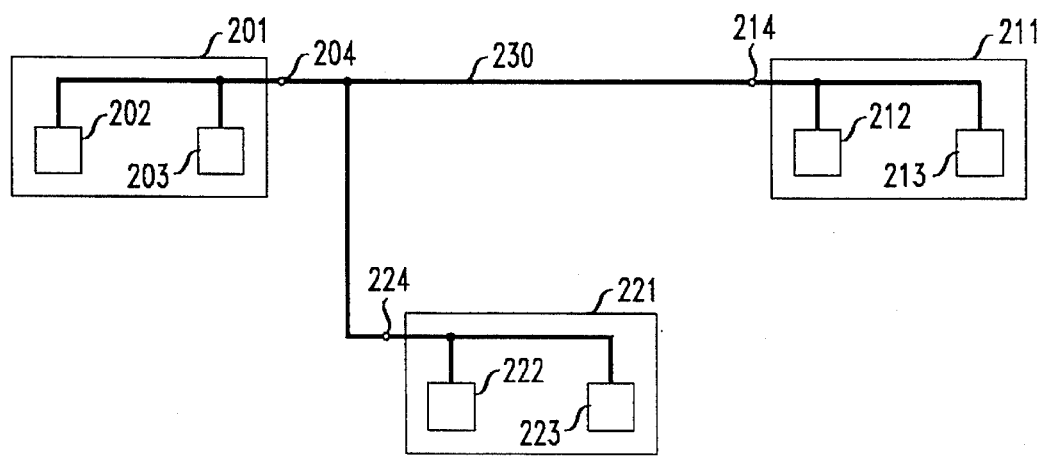
FIG. 2 is a diagram showing a number of cells in blocks interconnected by a network.

FIG. 2 shows a number of blocks 201, 211 and 221 having cells such as 202 and 203 in block 201 interconnected by net 230 to similar cells in blocks 211 and 221. Each block has a pin, such as 204, for net 230. FIG. 2 will be useful in explaining the effects of moving a cell from one block to another in the partitioning method to be described.

In general, the method starts with an initial partition and includes a number of passes in which an improved partition is obtained by moving selected cells between blocks. The method terminates when a pass yields a partition having little or no improvement over the previous partition.

Improvement from pass to pass is measured using a quality factor, such as the total number of pins used on all the blocks in the circuit being partitioned. The best partition is usually deemed to be that having the fewest pins. With such a quality factor, then, the goal in moving a cell from one block to another is to meet the size and pin constraints while reducing the total number of pins used.

One method of determining the initial partition is by arbitrarily dividing the cells of the circuit at random among the blocks to be used. For example, if a circuit containing 240 cells is to be implemented with three blocks having 100 cells each, 80 cells can be assigned at random to each block. Then, given the interconnections between cells specified in the netlist for the circuit, the number of pins on each block can be determined. Such an initial partition is usually made with the size constraints of the blocks met, but the pin constraint can be violated. The hope is that pin-constraint violations will be removed as the partitioning process proceeds.

The initial partition can also be specified by the circuit designer. This method may be advantageous if the designer is aware of particular relationships among the cells that suggest appropriate partitioning. The method described herein can then be used to optimize the partition.

In each pass of the exemplary method, a "benefit" measure is determined for moving each cell from its present block to each other block in the circuit. The cells are then moved in rank order of benefit, starting with a cell having the highest benefit. However, a cell is not moved if the move will violate one of the constraints. After a cell is moved, the cell is "locked," that is, such cell cannot be moved again during the current pass. Finally, the benefits for unmoved cells connected to the moved cell are adjusted to reflect the move. Such adjustment can change the rank order of the remaining cells.

After each cell move, the total pincount for all the blocks is determined. Such total pincount is used to track the quality of the partitions achieved after each move. However, during a given pass, the total pincount will not necessarily decrease monotonically with each move. That is, certain moves may cause the total pincount to decrease; others may cause an increase. Thus, after a pass is completed, the move for which the lowest total pincount was determined is selected as the move at which the pass should be terminated.

During the first few passes, the total pincount will typically decrease from pass to pass. Eventually, however, such decreases cease and additional cell moves are not likely to improve the quality of the partitions. Accordingly, when the difference in pincount between successive passes reaches zero or an insubstantial amount, the results of the previous pass can be taken as the best partition.

At least one of the constraints, such as the pin constraint, can be relaxed during the first few passes. As mentioned above, for the initial partition the pin constraint can be violated even if the size constraint is met. However, because of the methods used in determining benefit, the total pincount will usually decrease such that the pin constraint can be restored after the first few passes.

There can be cases in which the pincount reaches a relatively stable value and a constraint is still violated. In such a case, additional passes are not likely to result in a partition meeting the constraint. However, a new random initial partition can be determined, and the overall process repeated. If a successful partition is not achieved after a number of such repeats, then it probably will be necessary to use blocks having different numbers of cells and/or pins to implement the circuit.

When partitioning circuits using FPGAs, in which large numbers of identical cells are included in blocks, we have found it preferable to relax only the pin constraint and not the size constraint. Of course, in such a case, the size constraint is usually observed in the initial partition.

In the exemplary embodiment the benefits for each cell move are calculated as scalar values. These values can have two scalar components: a primary benefit indicating the "goodness" of a contemplated move, as determined in terms of the number of pins saved (or added) in making the move; and a secondary benefit, or "lookahead" factor, indicating the possible future effect of making the move.

In determining the benefits for the cells in a circuit, the primary and secondary benefits can be weighted. Such weights can be varied from pass to pass, if desired. For example, the secondary, or "lookahead" benefits can be given more weight during earlier passes. In the following description $\alpha$ and $\beta$ are used as the weights for the primary and secondary benefits, respectively. Some aspects of choosing such weights will be discussed below.

The notion of a "locked" cell was introduced in the above description, that is, a cell that has been moved during a pass and therefore cannot be moved again during that pass. As will be described, the primary and secondary benefits for a given cell move can be determined from the numbers of locked and free cells on the nets connected to the cell under consideration.

Each cell is typically connected to a number of nets, for example, as many as twenty for an FPGA cell. Thus, when a cell is being considered for a move, the effect on all nets connected to the cell must be taken into account. An advantage of the scalar benefit values used in the exemplary embodiment is that the benefit values for all the nets connected to a cell can be determined separately and then added to give the overall benefit value for moving a cell.

A multi-block net requires a pin on each block having cells in the net. For example, in FIG. 2, multi-block net 230 requires pins 204, 214 and 224 on blocks 201, 211 and 221, respectively. Pins on a multi-block net can be reduced by grouping the cells on the net in fewer blocks. If any cells on a net are locked, the way to reduce pins is to move free cells to blocks having locked cells. If all cells on a net can be grouped in the same block, all pins on the net can be eliminated. The benefits of cell moves are determined with these pin-reduction goals in view.

Accordingly, the benefit determination for moving a free cell connected to a given net from a source block to a destination block is based on the status (locked or free) and location of other cells connected to the net. Any given move will fall under one of four cases:

(1) Locked cells in both some block and destination block.

(2) At least one locked cell in source block only.

(3) At least one locked cell in destination block only.

(4) No locked cells in either source block or destination block.

In case 1, a pin for the net already exists on both source and destination blocks. The number of pins will not be changed by the move; therefore, the primary benefit is zero. However, if the number of cells on the net in the destination block is much larger than in the source block, there is a positive secondary benefit because it may be possible to move locked cells out of the source block in subsequent passes.

In case 2, the move is not desirable because it adds a locked cell to the destination block, thereby either adding a pin for the net to the destination block or preventing a pin already present from being removed. Also, if there was no locked cell on the net outside the source block, the move also adds a pin to the source block. Accordingly, the move will have a negative primary benefit. However, if the number of cells connected to the net is much greater in the destination block than the source block, the secondary benefit will be positive for the same reason as in case 1.

In case 3, if only one cell in the source block is connected to the net, the move eliminates the pin for the net on the source block and has positive primary benefit. If more than one cell in the source block is connected to the net, the move has no primary benefit but does have a positive secondary benefit because it may lead to elimination of the source-block pin in a subsequent pass. If all cells on the net other than those in the destination block are free, the move has still more positive secondary benefit because it may eventually lead to removal of all pins on the net.

In case 4, if the cell to be moved is the only cell on the net in the source block, the move eliminates a pin and has positive primary benefit. However, if there is no cell on the net in the destination block, the move adds a pin and has negative primary benefit. In all other cases, the move has only secondary benefit.

A numerical value for the benefit of a move on a given net can be determined from the following expression:

$$\text{Benefit} = \alpha(\text{Primary Benefit}) + \beta(\text{Secondary Benefit}) \quad (1)$$

where $\alpha$ and $\beta$ are the weighting factors described above.

Values of primary benefit and secondary benefit for the four cases described above can be determined from the expressions in Table I, where, for the cells on a net:

$L(S)$ = locked cells in source block $L(S')$ = locked cells outside source block $L(D)$ = locked cells in destination block $L(D')$ = locked cells outside destination block $T$ = total cells $T(S)$ = total cells in source block $T(D)$ = total cells in destination block

TABLE I

| CASE | PRIMARY BENEFIT | SECONDARY BENEFIT |
| --- | --- | --- |
| 1. $L(S) > 0$, $L(D) > 0$ | 0 | $[T(D) - T(S)]/T$ |
| 2. $L(S) > 0$, $L(D) = 0$ | | |
|   if $L(S') = 0$ and $T(D) - T(S) > T/2$ | $-2$ | $[T(D) - T(S)]/T$ |
|   if $L(S') = 0$ and $T(D) - T(S) \leq T/2$ | $-2$ | 0 |
|   if $L(S') > 0$ and $T(D) - T(S) > T/2$ | $-1$ | $[T(D) - T(S)]/T$ |
|   if $L(S') > 0$ and $T(D) - T(S) \leq T/2$ | $-1$ | 0 |

TABLE I-continued

| CASE | PRIMARY BENEFIT | SECONDARY BENEFIT |
| --- | --- | --- |
| 3. $L(S) = 0$, $L(D) > 0$ | | |
|   if $T(S) = 1$ | 1 | 0 |
|   if $T(S) > 1$ and $L(D') > 0$ | 0 | $[T(D) + T(S)]/T$ |
|   if $T(S) > 1$ and $L(D') = 0$ | 0 | $2[T(D) + T(S)]/T$ |
| 4. $L(S) = 0$, $L(D) = 0$ | | |
|   if $T(S) = 1$ and $T(D) > 0$ | 1 | 0 |
|   if $T(S) = 1$ and $T(D) = 0$ | 0 | 1 |
|   if $T(S) \neq 1$ and $T(D) = 0$ | 0 | $[T(D) - T(S)]/T$ |

The total benefit of moving a cell from a source block to a destination block is then found by adding the benefits determined for each net connected to the cell. Other methods of determining benefits of moving a cell between blocks can be used, if desired, without departing from the spirit and scope of the invention.

Figure 3:
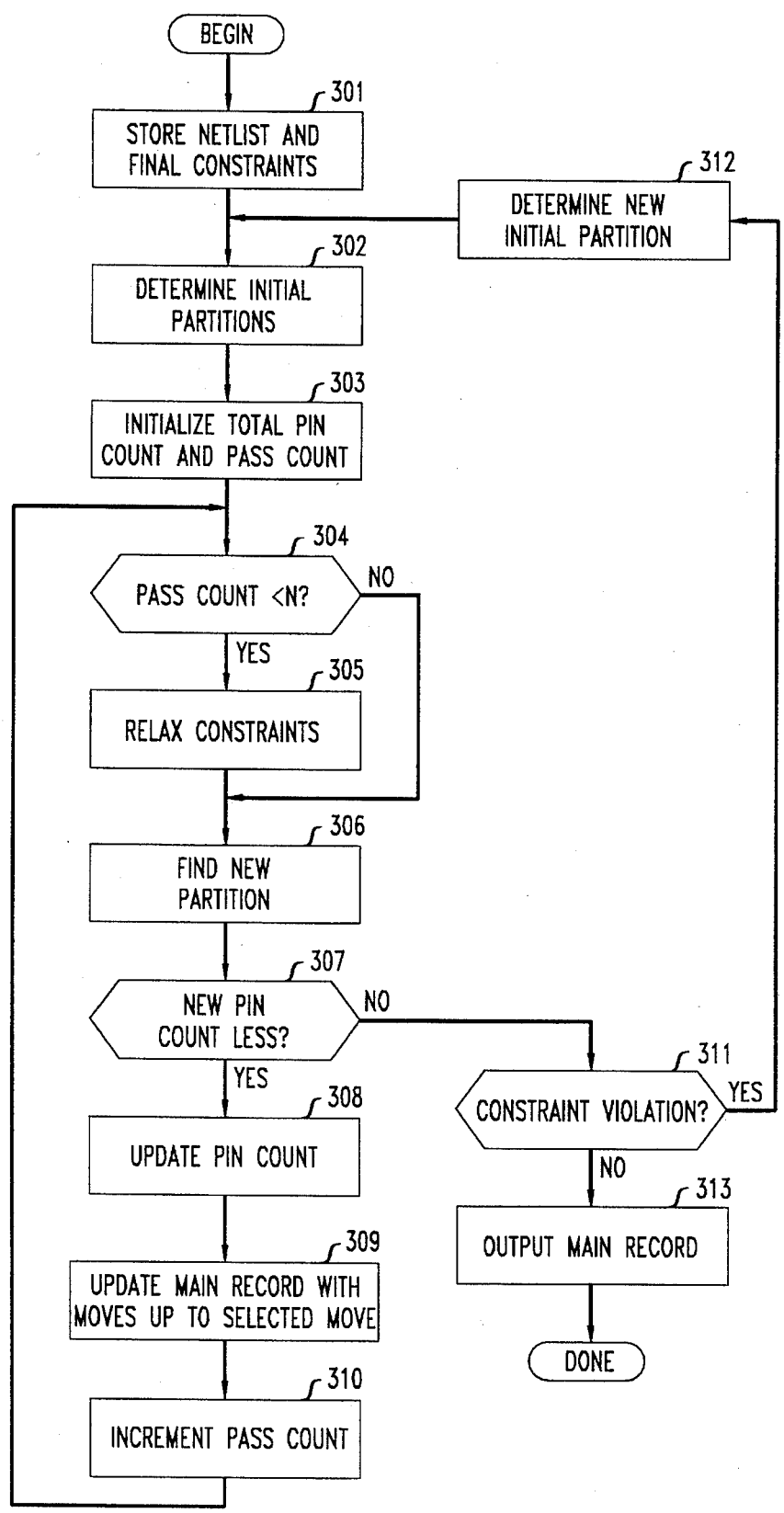
FIG. 3 is a flow chart of an exemplary method of assigning cells to blocks.

FIG. 3 is a flow chart of an exemplary method of partitioning a circuit using the techniques described above. Such method can be practiced in a general-purpose digital computer such as a Sun SPARCstation (tm) using the UNIX (r) operating system.

First, the netlist for the circuit to be partitioned and the final constraints for the circuit, such as the permitted number of cells in each block and the permitted number of pins on each block, are stored (step 301). The initial partition is then determined, such as by assigning the cells of the circuit to blocks at random or by using a specified initial partition (step 302) and the pin count and pass count are initialized (step 303). The pin count can be determined for each block by counting the number of nets in the stored netlist that have cells on the block.

In a preferred embodiment, the constraints are relaxed during the first few passes (steps 304 and 305). Relaxing the constraints effectively increases the search space available for determining advantageous cell moves. For example, in a circuit having blocks with 100 pins each, the pin constraint might be relaxed to 200 pins per block. The constraints preferably should always be relaxed to the extent needed to accommodate the initial partition while leaving room for cell movement. For example, if a block needs 120 pins for the initial partition, the relaxed pin constraint can be set at 130. Such constraint relaxation permits cell moves in the first few passes that otherwise would be blocked; it is desirable not to block moves that could have significant benefits later. An alternative approach is to relax constraints only when a cell move having a particularly high benefit would otherwise be blocked.

Figure 4:
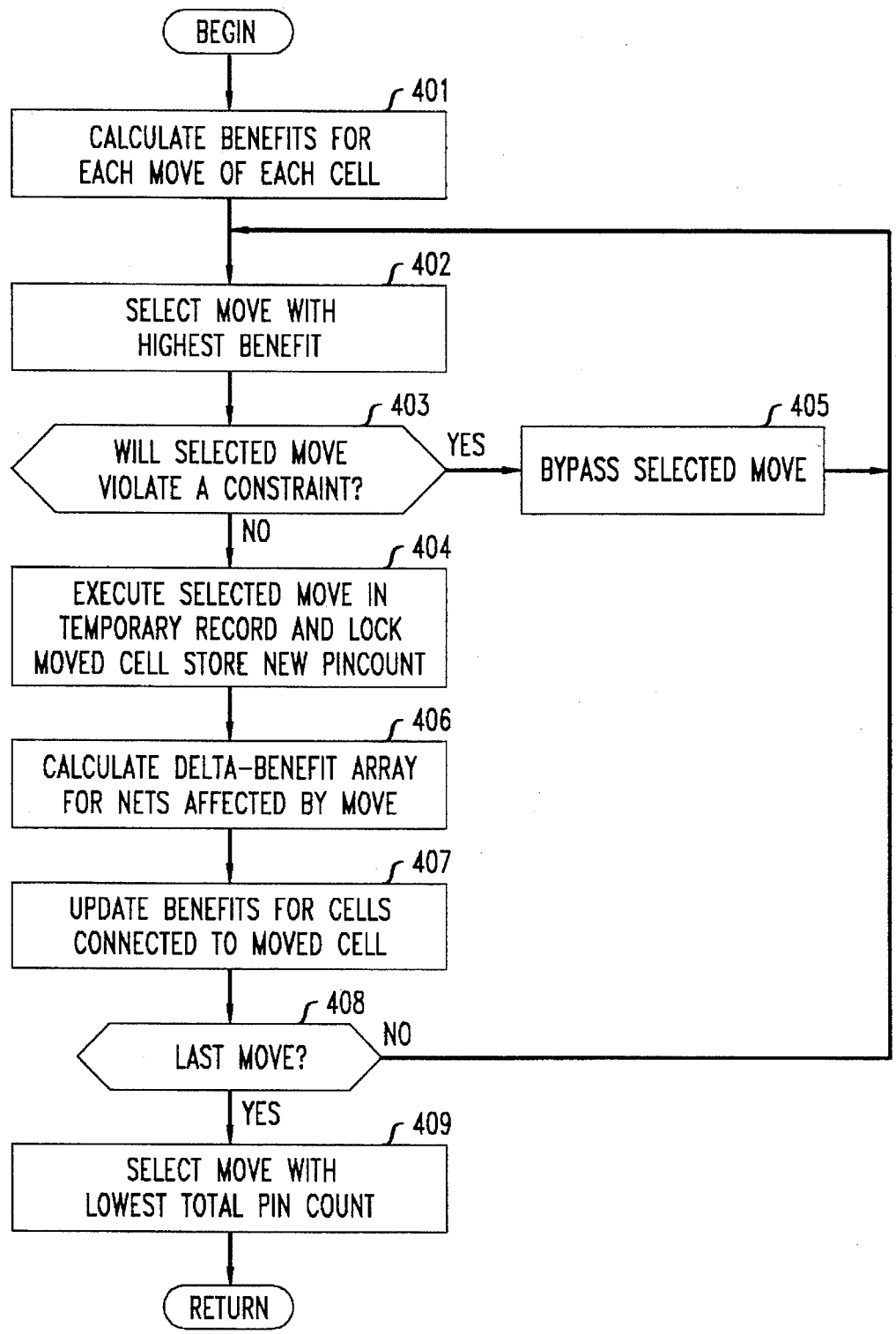
FIG. 4 is a flow chart showing the partitioning step of FIG. 3 in more detail.

A new partition is then found (step 36). FIG. 4 is a more detailed flow chart showing the steps of finding a partition. First, the benefits are calculated for each possible move of a cell to a different block, such as by using the expressions listed in Table I above (step 401). For example, in a circuit being partitioned into four blocks, a separate benefit is calculated for moving each cell from its source block to each of the three possible destination blocks. Note that all the cells are free at the beginning of the partitioning step. Accordingly, the benefit for each move is calculated in accordance with the expressions in Table I for Case 4. Typically, a number of different benefit values will result, with more than one move having the same benefit value.

On completion of the benefit calculations, a free-cell move having the highest benefit value is selected (step 402)

and the move checked to determine whether it will violate any of the constraints, such as the size constraint or the pin constraint (step 403). If the move does not violate constraints, the move is executed in a temporary partition record and the moved cell is recorded as locked. Also, a new pin count for the circuit is calculated and stored in association with the move (step 404).

After a move is completed, the benefits of the next move are recalculated for each free cell on the nets connected to the moved cell. This can be accomplished efficiently by calculating incremental benefit values resulting from the move and arranging such incremental values for each net in the form of an m×m array, where m is the number of blocks (step 406). Such an array is called a "delta-benefit" array.

Each entry (i,j) in a delta-benefit array is determined as follows:

$$\Delta \text{Benefit}\ (i,j) = \text{Benefit}\ (i,j)\ \text{after the move} - \text{Benefit}\ (i,j)\ \text{before the move} \qquad (2)$$

where Benefit (i,j) is the benefit of moving a free cell from block i to block j.

After such array is calculated for each net connected to the moved cell, the benefits for each move of the free cells connected to the moved cell can be updated (step 407). In updating a benefit for a given free cell move, the $\Delta$ Benefit value for such move from the delta-benefit array for each net connected to the free cell is added to the present benefit.

Steps 402, 403, 404, 406 and 407 are repeated until all free cell moves possible without violating a constraint have been completed (step 408). If a selected cell move would violate a constraint (step 403), such move is bypassed (step 405). However, a subsequent move of the same cell to a different destination block may be found possible when the benefit value of such subsequent move is reached. On returns to step 402 from step 405 or step 408, another cell with the highest benefit value is selected until all cells with that value have been considered. When all cells having that benefit value have been selected, the next-highest benefit value is used, and so on.

After the last move has been completed, the move with the lowest total pin count stored in step 404 is selected as the best final move for the pass (step 409). Returning now to the flow chart in FIG. 3, if the new pin count is less than that determined during the previous pass (or stored initially), then such pin count is updated (step 308) and the main record of the partition is updated with the moves stored in the temporary record during step 404 up to and including the move selected in step 409.

Partitioning passes are repeated until the new pin count after a pass is no longer less than (or substantially less than) the previous pin count (step 307), indicating that subsequent passes will not be worth while. After N passes have been completed (where N is chosen as a parameter by the user, for example, N can be 3) the constraints are no longer relaxed and each cell move must meet the stored final constraints.

After the last pass, a final check is made to determine whether constraints have been violated (step 311). If so, then a new initial partition is determined (step 312) and the partitioning process is repeated. If not, the process is complete and the final partition stored in the main record can be output for use (step 313). It is desirable to limit the number of repetitions of the loop through step 312, that is if a number of new partitions is unsuccessful, then more generous constraints will probably be needed to achieve a successful partition.

In choosing values for weighting factors $\alpha$ and $\beta$ we have found that the best partitions (fewest pins) result if $\alpha > 2\beta$ for example, $\alpha = 10$ and $\beta = 3$. However, to obtain the best partition, it may be necessary to try different initial partitions with different combinations of these weighting factors. Thus, step 312 can include determining new values for $\alpha$ and $\beta$ as well as, or in addition to, determining a new initial partition.

As mentioned above, an advantageous way of changing weighting factors $\alpha$ and $\beta$ is to use one set of values for early passes and another set of values for later passes. For example, the weighting factors can be changed after the pass count reaches a predetermined threshold. Such changes can be made after step 310 and before repeating step 304.

Instead of, or in addition to, changing the weighting factors, the expressions used for calculating the benefits can also be changed based on the pass count. That is, expressions such as those shown in Table I might be used for the initial one or more passes and different expressions might be used for subsequent passes.

Figure 5:
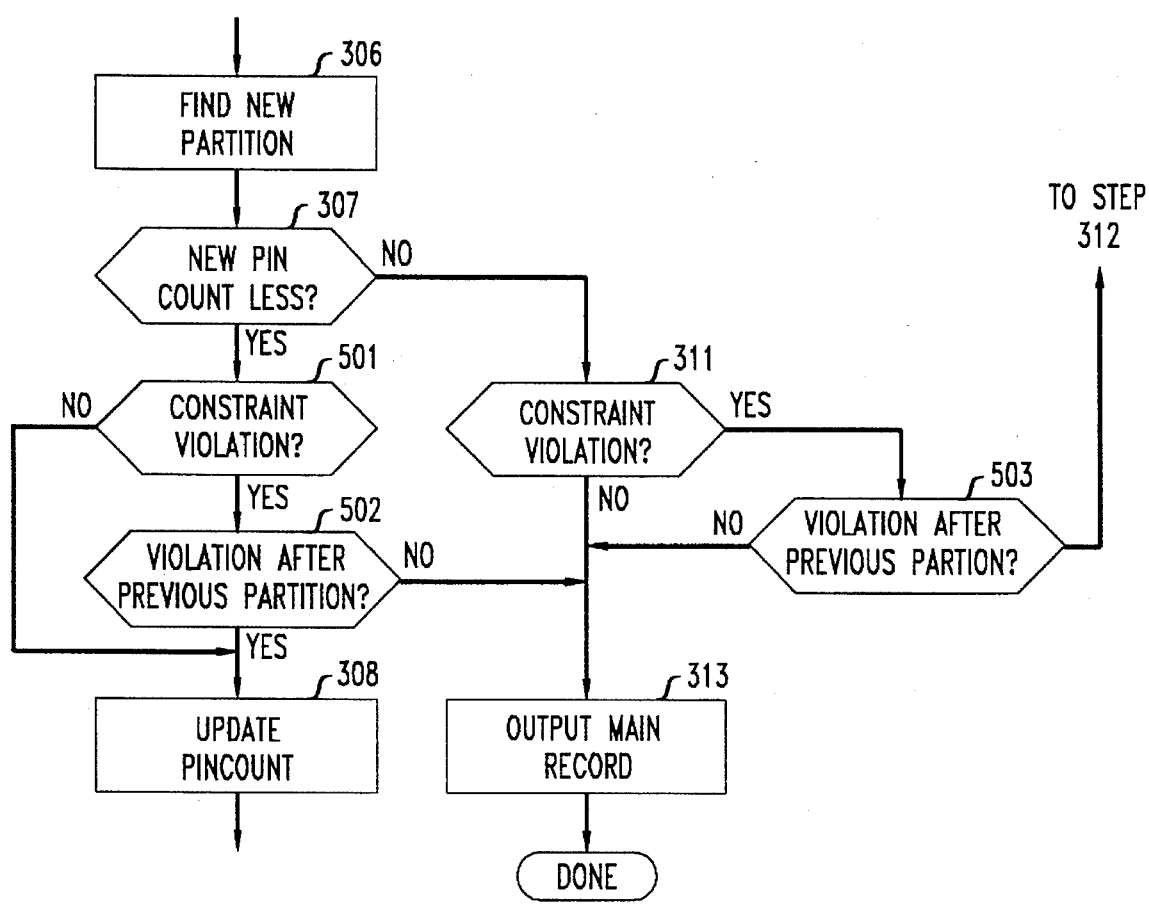
FIG. 5 is a partial flow chart showing a variation of the method of FIG. 3.

FIG. 5 is a partial flow chart showing an enhancement to the method just described. Steps 306, 307, 308 and 313 are the same as described for FIG. 3; new steps 501, 502 and 503 have been added. If the new pin count is found to be less in step 307, a check is made to see if there is a constraint violation in any block (step 501). If not, then the method continues with step 308 as in FIG. 3. However, if there is such a violation, a further check is made to determine whether there was a constraint violation after the previous pass (step 502). If not, the process is terminated by performing step 313, which outputs the main record reflecting the updated results of the previous pass. However, if a constraint violation existed after the previous pass, the process is continued because the pin count is still decreasing and the next pass may remove the violation.

Similarly, if a constraint violation is found in step 311, the previous pass is checked (step 503), and if that pass was not in violation, step 313 is performed to terminate the process with the previous pass as output. In this case, if the previous pass is also in violation, then a new initial partition is determined (step 312).

The invention has been shown and described with reference to particular embodiments. However, it will be understood by those skilled in the art that various changes may be made therein without departing from the spirit and scope of the invention.

What is claimed is:

1. A machine method of partitioning interconnected cells into blocks, said blocks having one or more constraints on the placement of cells therein, which comprises:

assigning said cells to said blocks to form an initial partition;

calculating an overall quality factor for said initial partition;

finding a new partition by moving cells from block to block, said moves being selected so as not to violate said constraints and in accordance with the likelihood of improving said quality factor;

recalculating said overall quality factor for said new partition; and repeating said finding and recalculating steps until said quality factor ceases to improve substantially and with at least the first of said repetitions being performed with at least one of said constraints relaxed and the last of said repetitions being performed with none of said constraints relaxed.

2. A machine method of partitioning interconnected cells into blocks, said blocks having one or more constraints on the placement of cells therein, which comprises:

assigning said cells to said blocks to form an initial partition;

calculating an overall quality factor for said initial partition;

finding a new partition by moving cells from block to block, said moves being selected so as not to violate said constraints and in accordance with the likelihood of improving said quality factor;

recalculating said overall quality factor for said new partition; and repeating said finding and recalculating steps until said quality factor ceases to improve substantially and with at least the first of said repetitions being performed with at least one of said constraints relaxed and the last of said repetitions being performed with none of said constraints relaxed;

and wherein said finding step comprises;

calculating a benefit value for each possible cell move, each said benefit value being a scalar value indicating the likelihood that said cell move will improve said quality factor;

executing said cell moves in rank order of said benefit values, omitting cell moves that violate said constraints;

after each cell move;

locking said cell to prevent moving said cell again during the current finding step;

modifying said quality factor to reflect the quality of the partition resulting from said cell move and associating said modified quality factor with said cell move; and recalculating the benefit values for remaining possible cell moves to reflect the effect of said executed cell move;

after the last cell move is executed;

selecting the cell move associated with the best quality factor; and using the partition resulting from the moves ending with said selected cell move as the new partition.

3. The method of claim 1 wherein said quality factor is the total number of terminal pins on said blocks and the object of said partitioning method is to minimize said total number.

4. The method of claim 1 wherein one of said constraints is the number of cells in each block.

5. The method of claim 1 wherein one of said constraints is the number of terminal pins on each block.

6. The method of claim 1 which further comprises:

if one or more of said constraints is violated after the last repetition of said finding and recalculating steps, reassigning said cells to said blocks at random to form a new initial partition and reiterating said calculating, finding, recalculating and repeating steps.

7. The method of claim 1 which further comprises:

if one or more of said constraints is violated after a repetition of said finding and recalculating steps and none of said constraints were violated in the preceding repetition of said finding and recalculating steps, selecting the partition resulting from said preceding repetition as the result of said method.

8. The method of claim 1 wherein said benefit-value calculating step comprises:

for each possible cell move, calculating a separate benefit value for each net connected to the cell being moved, and combining the separate benefit values for each net to obtain the overall benefit value for said cell move.

9. The method of claim 8 wherein said benefit-value calculating step comprises:

calculating each benefit value for said net based on one or more of the following factors:

the number of locked cells on said net in the source block where said cell is located before said move;

the number of locked cells on said net in the destination block where said cell will be located after said move;

the number of locked cells on said net outside said source block;

the number of locked cells on said net outside said destination block;

the total number of cells on said net;

the total number of cells on said net in said source block; and the total number of cells on said net in said destination block.

10. The method of claim 8 wherein said benefit-value calculating step further comprises:

calculating a primary benefit value reflecting the actual benefit of said cell move;

calculating a secondary benefit value reflecting the possible future benefit of said cell move and combining said primary benefit value and said secondary benefit value to obtain said separate benefit value.

11. The method of claim 10 which further comprises:

before said combining step, applying a weighting factor to at least one of said said primary benefit value and said secondary benefit value.

12. The method of claim 11 which further comprises:

changing said weighting factors in accordance with the number of repetitions of said finding step completed.

13. The method of claim 1 in which said recalculating step further comprises:

for each net connected to the moved cell:

calculating incremental benefit values for moving an additional cell from each block to each other block, each incremental benefit value being based on the benefit of moving said additional cell before said completed move and the benefit of moving said additional cell after said completed move; and for each remaining possible move of a free cell connected to said moved cell, combining the present benefit value of said possible move with the incremental benefit values for such move calculated for the net or nets connecting said free cell to said moved cell.

14. The method of claim 1 which further comprises:

changing the method of calculating said benefit values in accordance with the number of repetitions of said finding step completed.

* * * * *